(12) United States Patent
Kang (10) Patent No.: US 6,903,407 B1
(45) Date of Patent: Jun. 7, 2005

(54) NON VOLATILE CHARGE TRAPPING DIELECTRIC MEMORY CELL STRUCTURE WITH GATE HOLE INJECTION ERASE

(75) Inventor: Jun Kang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 45 days.

(21) Appl. No.: 10/684,890

(22) Filed: Oct. 14, 2003

(51) Int. Cl.⁷ ............................................. H01L 29/788
(52) U.S. Cl. .................. 257/315; 257/314; 257/324; 257/327; 257/329; 365/185.26
(58) Field of Search ................................ 257/314, 324, 257/327, 329; 365/185.26

(56) References Cited

U.S. PATENT DOCUMENTS 6,639,271 B1 * 10/2003 Zheng et al. ................ 257/324
6,735,123 B1 * 5/2004 Tripsas et al. ......... 365/185.26

* cited by examiner

*Primary Examiner*—David Nelms
*Assistant Examiner*—Mai-Huong Tran
(74) *Attorney, Agent, or Firm*—Renner, Otto, Boisselle, & Sklar, LLP (57) ABSTRACT

A dielectric memory cell comprises a substrate which includes a source region, a drain region, and a channel region positioned there between. A multilevel charge trapping dielectric is positioned on the surface of the substrate and a control gate is positioned on the surface of the dielectric and is positioned over and aligned with the channel region. The multilevel charge trapping dielectric includes a tunneling dielectric layer, a charge trapping dielectric layer, and a top dielectric layer. The tunneling dielectric layer comprises a first dielectric material having a wide band gap between a tunneling dielectric layer valance band Fermi level and a tunneling dielectric layer conduction band Fermi level. The top dielectric layer comprises a second dielectric material having a valance band Fermi level approximately equal to the tunneling dielectric layer valance band Fermi level and having a conduction band Fermi level greater than the tunneling dielectric layer conduction band Fermi level. The charge trapping layer is positioned between the bottom layer and the top layer of a third dielectric with charge trapping properties.

22 Claims, 6 Drawing Sheets

NON VOLATILE CHARGE TRAPPING DIELECTRIC MEMORY CELL STRUCTURE WITH GATE HOLE INJECTION ERASE

TECHNICAL FIELD

The present invention relates generally to a non volatile charge trapping dielectric memory cell array and, more specifically to improvements in scalable non volatile dielectric memory cells and methods of erasing non volatile charge trapping dielectric memory cells.

BACKGROUND OF THE INVENTION

Conventional floating gate flash memory types of EEPROMs (electrically erasable programmable read only memory), utilize a memory cell characterized by a vertical stack of: i) a tunnel oxide ($SiO_2$), ii) a polysilicon floating gate over the tunnel oxide, iii) an interlayer dielectric over the floating gate, and iv) a control gate over the interlayer dielectric. Such vertical stack is positioned over a crystalline silicon substrate. Within the substrate are a channel region positioned below the vertical stack and source and drain diffusions on opposing sides of the channel region.

The floating gate flash memory cell is programmed by inducing hot electron injection from the channel region to the floating gate to create a non volatile negative. charge on the floating gate. Hot electron injection can be achieved by applying a drain to source bias along with a high control gate positive voltage. The gate voltage inverts the channel while the drain to source bias accelerates electrons towards the drain. The accelerated electrons gain 5.0 to 6.0 eV of kinetic energy which is more than sufficient to cross the 3.2 eV Si—$SiO_2$ energy barrier between the channel region and the tunnel oxide. While the electrons are accelerated towards the drain, those electrons which collide with the crystalline lattice are re-directed towards the Si—$SiO_2$ interface under the influence of the control gate electrical field and gain sufficient energy to cross the barrier.

Once programmed, the negative charge on the floating gate increases the threshold voltage of the FET characterized by the source region, drain region, channel region, and control gate. During a "read" of the memory cell, the magnitude of the current flowing between the source and drain at a predetermined control gate voltage indicates whether the flash cell is programmed.

The erase function is typically performed using Fowler-Nordheim (FN) tunneling through the floating gate/tunnel oxide barrier. More specifically, large negative voltage is applied to the control gate, a moderate positive voltage is applied to the source, and the drain is floated. Under such bias conditions, the electrons stored on the floating gate tunnel into the tunnel oxide and are swept Into the source region.

More recently dielectric memory cell structures have been developed. A dielectric memory cell is characterized by a vertical stack of: i) an insulating bottom oxide layer, ii) a charge trapping dielectric layer, iii) an insulating top oxide layer, and iv) a polysilicon control gate. Such vertical stack is positioned on top of a crystalline silicon substrate. Within the substrate are a channel region positioned below the vertical stack and source and drain diffusions on opposing sides of the channel region.

Similar to the floating gate device, the charge trapping dielectric memory cell structure is programmed utilizing hot electron injection. However, it should be appreciated that because the injected electrons are trapped in the nitride/bottom oxide junction, the charge remains close to the source region or the drain region from which the electrons were injected. As such, the charge trapping dielectric memory cell may be used to store two bits of data per cell.

A charge trapping dielectric memory cell is erased by injecting hot holes created by Band to Band (BTB) tunneling. More specifically, the source is floated and an appropriate positive voltage is applied to the drain region to create the BTB tunneling. A negative voltage is applied to the control gate to accelerate holes towards the charge trapping layer.

A problem associated with hot hole injection is that it damages the bottom oxide and its Interface with the silicon substrate. It is thought that a large portion of the injected holes become trapped in the bottom tunnel oxide and, the trapped holes generate interface states between the bottom tunnel oxide layer and the silicon channel.

Therefore, there is a need in the art for a dielectric memory cell structure which does not suffer the damage to the tunnel oxide during erase cycles. More specifically, there is a need in the art for a dielectric memory cell structure which can provide for erasure by hole injection from the gate.

SUMMARY OF THE INVENTION

A first aspect of the present invention is to provide a novel dielectric memory cell structure with band gap engineering to provide for gate hole injection erase techniques to be used for neutralizing a stored charge. The novel dielectric memory cell comprises a substrate, a multi-level charge trapping dielectric positioned on the surface of the substrate, and a control gate. The substrate comprises a source region, a drain region, and a channel region positioned between the source region and the drain region. The control gate is positioned on the surface of the multilevel charge trapping dielectric and is positioned over and aligned with the channel region.

The control gate may comprise a polysilicon compound heavily implanted with a group III hole donor element such as Boron. Alternatively, the control gate may comprise a material with a conduction band Fermi level approximately the same as the conduction band Fermi level of silicon but with a valance band Fermi level below that of silicon to facilitate hole injection. Such a control gate may comprise a material selected from a group of materials consisting of GaN, ZnS, and C. Such material may further be heavily implanted with a group III hole donor impurity to facilitate hole injection when the gate Is positively charged with respect to the channel region.

The multilevel charge trapping dielectric includes a tunneling dielectric layer, a top dielectric layer, and a charge trapping dielectric layer that is positioned between the tunneling dielectric layer and the top dielectric layer. The tunneling dielectric layer is adjacent to the substrate and comprises a first dielectric material. The first dielectric material has a wide band gap between a tunneling dielectric layer valance band Fermi level and a tunneling dielectric layer conduction band Fermi level. The tunnel dielectric layer may be silicon dioxide. The thickness of the tunneling dielectric layer defines a tunnel dielectric layer thickness.

The top dielectric layer is adjacent to the control gate and comprises a second dielectric material. The second dielectric material may also be silicon dioxide. The thickness of the top dielectric layer defines a top dielectric layer thickness that is less than the tunnel dielectric layer thickness.

Alternatively, the second dielectric material may be a material with a valance band Fermi level approximately equal to the valance band Fermi level of silicon dioxide, but with a conduction band Fermi level greater than the conduction band Fermi level of silicon dioxide.

In such alternative embodiment, the second dielectric material may be a dielectric material selected from a group of dielectric materials consisting of aluminum oxide compound, a Hafnium oxide compound, and a zirconium oxide compound or, more specifically, a compound selected from the group of compounds consisting of $Al_2O_3$, $HfSi_xO_y$, $HfO_2$, $ZrO_2$, and $ZrXi_x$, $O_y$.

The charge trapping dielectric may be a nitride compound such as a nitride compound selected from the group of nitride compounds consisting of $Si_2N_4$ and $SiO_xN_4$.

For a better understanding of the present Invention, together with other and further aspects thereof, reference is made to the following description, taken in conjunction with the accompanying drawings. The scope of the invention is set forth in the appended claims.

DESCRIPTION OF THE PREFERRED EMBODIMENTS

The present invention will now be described in detail with reference to the drawings. In the drawings, like reference numerals are used to refer to like elements throughout.

Figure 1:
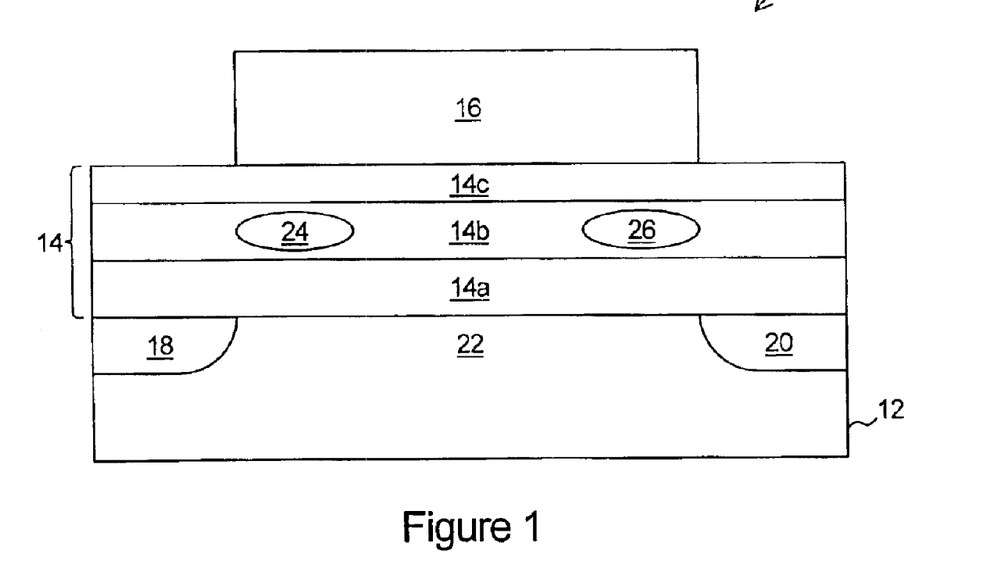
FIG. 1 is a cross section diagram of a dielectric memory cell in accordance with one embodiment of this invention.

Referring to FIG. 1, a cross section view of a dielectric memory cell 10 formed on a semiconductor substrate 12 is shown. The diagram is not drawn to scale and the dimensions of some features are intentionally drawn larger than scale for purposes of showing clarity.

The memory cell 10 is shown as a substantially planar structure formed on the bulk substrate 12. However, it should be appreciated that the teachings of this invention may be applied to both planar, fin formed, and other dielectric memory cell structures which may be formed on either bulk substrates, SOI substrates or other substrate structures.

The memory cell 10 includes a multi layer charge trapping dielectric 14 positioned between the bulk substrate 12 and a control gate 16.

The bulk substrate 12 preferably comprises lightly doped p-type silicon and includes an n-type Implanted source region 18 and an n-type implanted drain region 20 on opposing sides of a p-type central channel region 22. The central channel region 22 is positioned beneath, and aligned with, the control gate 16.

The charge trapping dielectric 14 comprises three layers. The bottom layer or tunneling dielectric layer 14a, a central or charge trapping dielectric layer 14b, and a top dielectric layer 14c.

The memory cell 10 is configured to store two quantities of charge, each representing a single bit of data. The first bit of data is represented by the storage of trapped electrons in a charge trapping region 24 of the charge trapping dielectric layer 14b adjacent to the source region 18. The second bit of data is represented by the storage of trapped electrons In a charge trapping region 26 of the charge trapping dielectric layer 14b adjacent to the drain region 20.

Figure 2A:
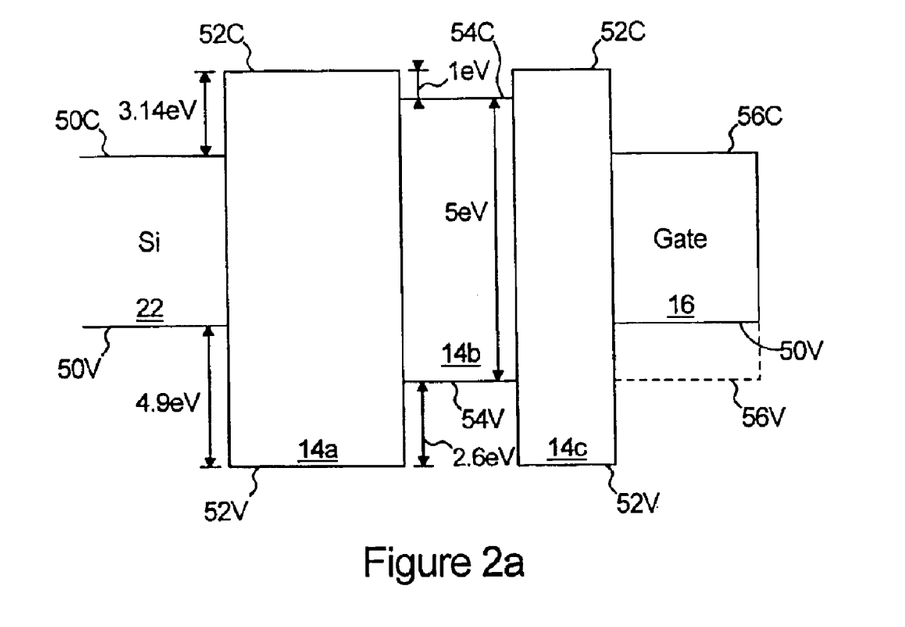
FIG. 2a is a band gap diagram representing the dielectric memory cell of FIG. 1 in an unbiased state.

FIG. 2a represents a band gap diagram of the memory cell 10. Referring to FIG. 2a in conjunction with FIG. 1. As discussed, the silicon substrate 12 comprising the channel region 22 may be crystalline silicon lightly implanted with a group III hole donor impurity such as boron. The lightly doped p-type crystalline silicon channel region 22 is characterized by a 1.1 eV band gap between the Fermi level of its conduction band 50c and the Fermi level of its valance band 50v.

The tunneling dielectric layer 14a may comprise silicon dioxide. Silicon dioxide is an insulator and is characterized by a wide band gap between a Fermi level of its valance band 52v and a Fermi level of its conduction band 52c. As such, the Fermi level of the valance band 50v of the channel region 22 is 4.9 eV above the Fermi level of a valance band 52v of the silicon dioxide tunneling dielectric layer 14a. And the Fermi level of the conduction band 50c of the channel region 22 is 3.14 eV below the Fermi level of the conduction band 52c of the silicon dioxide tunneling dielectric layer 14a.

In the exemplary embodiment, the tunneling dielectric layer 14a has a thickness within a range of about 50 Å to about 150 Å. An embodiment with a more narrow bracket includes a tunneling dielectric layer 14a thickness within a range of about 70 Å to about 130 Å.

The top dielectric layer 14c may also comprise polysilicon, but with a thickness less than the thickness of the tunneling dielectric layer 14a. The thickness of the top dielectric layer 14c may be within a range of about 70 Å to 130 Å. An embodiment with a more narrow bracket includes a top dielectric layer 14c thickness within a range of about 80 Å to about 120 Å and even narrower yet, a top dielectric layer 14c thickness of about 90 Å to about 100 Å.

In an alternative embodiment, the tunneling dielectric layer 14c may comprise an insulating material characterized by a band gap between a Fermi level of its valance band and a Fermi level of its conduction band that is greater than the band gap of silicon dioxide. In such alternative embodiment, the tunneling dielectric layer 14c may comprise a material selected from a group of dielectric materials consisting of aluminum oxide compound, a Hafnium oxide compound, and a zirconium oxide compound or, more specifically, a compound selected from the group of compounds consisting of $Al_2O_3$, $HfSi_xO_y$, $HfO_2$, $ZrO_2$, and $ZrXi_xO_y$.

The charge trapping dielectric layer 14b is characterized by a 5 eV band gap between the Fermi levels of its conduction band 54c and the Fermi level of its valance band 54v. The Fermi level of the valance band 54v of the charge trapping dielectric layer 14b is 2.6 eV above the Fermi level of the valance band 52v of the silicon dioxide tunneling dielectric layer 14a. The Fermi level of the conduction band 54c of the charge trapping dielectric layer 14b is 1 eV below the Fermi level of the conduction band 52c of the silicon dioxide tunneling dielectric layer 14a.

An exemplary material with such properties may comprise a nitride compound such as a nitride compound selected from the group of nitride compounds consisting of $Si_2N_4$, $Si_3N_4$, and $SiO_xN_4$. The charge trapping dielectric layer 14b may be further implanted with any of another group IV semiconductor, a group V electron donor element such as arsenic, or a group III hole donor element such as boron to further alter the Fermi level of the conduction band 54c or the Fermi level of the valance band 54v.

The thickness of the charge trapping dielectric layer 14b may be within a range of about 50 Å to 150 Å. An embodiment with a more narrow bracket includes a charge trapping dielectric layer 14b thickness within a range of about 70 Å to about 130 Å.

The control gate 16 may be comprised of a polysilicon based compound. In the exemplary embodiment the control gate 16 has a Fermi level of the conduction band 56c that is 3.14 eV below the Fermi level of the conduction band 52c of silicon dioxide (e.g. the Fermi level of the conduction band 52c of the control gate 16 is approximately that of pure polysilicon) and has a Fermi level of a valance band 56v that is at a lower Fermi level than the Fermi level of the valance band 50v of silicon. Such a silicon based compound may comprises polysilicon implanted with a group III hole donor element such as boron to create p-type polysilicion.

As an alternative, the control gate 16 may be comprised of a material selected from a group of materials consisting GaN, ZnS, and C. Each of the materials has a greater band gap than that of polysilicon (e.g. 3.36 eV, 3.68 eV, and 5.36 eV respectively), has a conduction band Fermi level similar to the conduction band Fermi level of silicon, and has a valance band Fermi level below the valance band Fermi level of silicon to facilitate hole injection from the control gate 16 through the top dielectric layer 14c.

Programming

Figure 2B:
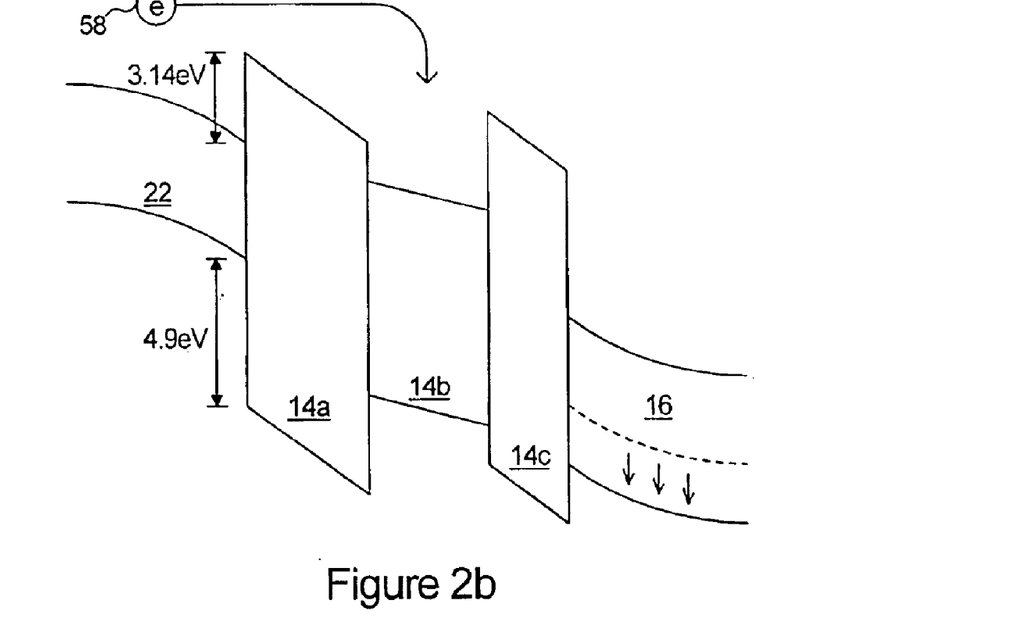
FIG. 2b is a band gap diagram representing the dielectric memory cell of FIG. 1 in a programming state.

The band gap diagram of FIG. 2b represents operation of the field effect transistor 10 in a programming state. Referring to FIG. 2b in conjunction with FIG. 1, programming of each charge trapping region 24 and 26 is achieved by injecting electrons from the channel region 22 of the substrate 12 through the tunneling dielectric layer 14a into each of the charge trapping regions 24 and 26.

More specifically, programming of the charge trapping region 24 comprises applying a source region 18 to drain region 20 bias that is adequate to increase the kinetic energy gain of electrons 58 within the channel region 22 above the 3.1 eV to 3.5 eV energy barrier at the interface between the channel region 22 and the tunneling dielectric layer 14a.

While the electrons 58 are at the high energy state, a positive voltage is applied to the control gate 16 to redirect the electrons towards the dielectric layer 14. Those electrons which cross the interface into the tunneling dielectric layer 14a become trapped in the charge trapping dielectric layer 14b in the charge trapping region 24.

This may be accomplished by grounding the drain region 20, applying approximately 6V to the source region 18, and applying approximately 10V to the control gate 16. The control gate 16 voltage inverts the channel region 22 while the source region 18 to drain region 20 bias accelerates electrons from the source region 18 into the channel region 22 towards the drain region 20. The 5.5 eV to 6 eV kinetic energy gain of the electrons is more than sufficient to surmount the 3.1 eV to 3.5 eV energy barrier between the channel region 22 and the tunneling dielectric layer 14a.

Similarly, the charge storage region 26, may be programmed by grounding the source region 18, applying approximately 6V to the drain region 20, and applying approximately 10V to the control gate 16. The drain region 20 to source region 18 bias accelerates electrons from the drain region 20 into the channel region 22 towards the source region 18 and the high voltage on the control gate 16 redirects the electrons towards the tunneling dielectric layer 14a. Those electrons which cross the interface into the tunneling dielectric layer 14a become trapped in the charge trapping layer 14b in the charge trapping region 26.

It should be appreciate that the Fermi level of the conduction band 52c of the top layer 14c prevents transfer of electrons from the charge trapping dielectric layer 14b to the positively biased control gate 16 during programming of either the charge trapping region 24 or the charge trapping region 26. Further, the difference in potential between the 10v applied to the control gate 16 and the potential of the channel region 22 between the grounded source region 18 (or drain region 20) and the 6v biased drain region 20 (or source region 18) is insufficient to inject hoes from the control gate 16 into the top dielectric layer 14c Reading The presence of trapped electrons within either the charge trapping region 24 or the charge trapping region 26 effects depletion within the channel region 22 and as such effect the threshold voltage of a field effect transistor (FET) characterized by the control gate 16, the source region 18 and the drain region 20. Therefore, each bit may be "read", or more specifically, the presence of electrons stored within either charge trapping region 24 or the charge trapping region 26 may be detected, by operation of the FET. More specifically, .the presence of electrons stored within charge trapping region 24 may be detected by applying a positive voltage to the control gate 16 and a lesser positive voltage to the to the drain region 20 while the source region 18 is grounded. The current flow through the channel region 22 is then measured at the drain region 20. If the charge trapping region 24 is negatively charged (e.g. there are electrons trapped within charge trapping region 24) no current will be measured. Otherwise, if the charge trapping region 24 is charge neutral (e.g. no trapped electrons) then there will be a measurable current flow.

Similarly, the presence of electrons stored within charge trapping region 26 may be detected by applying a positive voltage to the control gate 16 and a lesser positive voltage to the to the source region 18 while the drain region 20 is grounded. Again, the current flow is then measured at either the source region 18 or the drain region 20. If the charge trapping region 26 is negatively charged, no current will be measured. Otherwise, if the charge trapping region 26 is charge neutral then there will be a measurable current flow.

Erasure

Figure 2C:
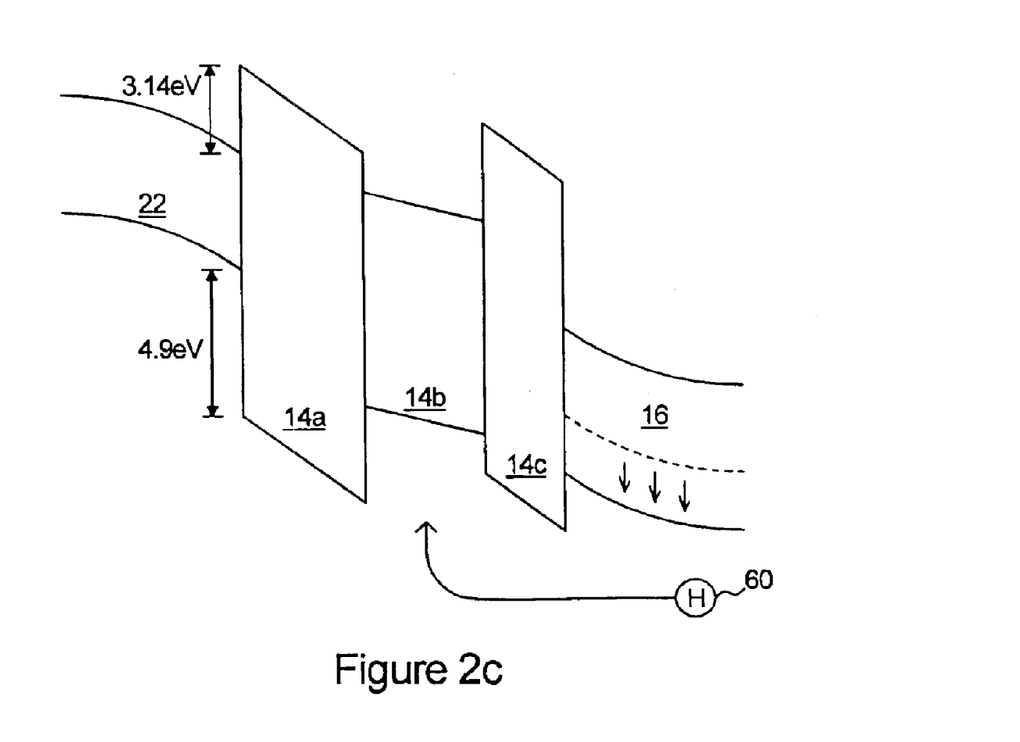
FIG. 2c is a band gap diagram representing the dielectric memory cell of FIG. 1 in an erase state.

The band gap diagram of FIG. 2c represents operation of the field effect transistor 10 in an erase state. Referring to FIG. 2c in conjunction with FIG. 1, the erasure of both the charge trapping region 24 and the charge trapping region 26 may be accomplished by injecting holes from the control gate 16 through the top layer 14c into the charge trapping layer 14b.

More specifically, erasure of the charge trapping regions 24 and 26 comprises applying positive voltage to the control gate 16 while applying a negative voltage to the substrate 22. The voltage differential in combination with any negative charge stored in either charge trapping region 24 or 26 is adequate to decrease the Fermi level of holes 60 in the control gate 16 below the less-than-4.9 eV barrier at the interface between the control gate and the thin top dielectric layer 14c while the negative voltage applied to the substrate 22 directs the holes into the top dielectric layer 14c. At which point, holes are injected into charge trapping region 24 and charge trapping region 26 thereby neutralizing any negative charge stored therein. The positive voltage applied to the control gate 16 and the negative voltages applied to the substrate 22 are such that the potential difference is inadequate to inject holes into a charge neutral charge trapping region 24 or 26 but adequate (in combination with a negative charge trapped in charge trapping region 24 or 26) to inject holes into a negatively charged charge trapping region 24 or 26. As such, charge trapping regions 24 and 26 will never become positively charged.

Exemplary Fabrication

Figure 3:
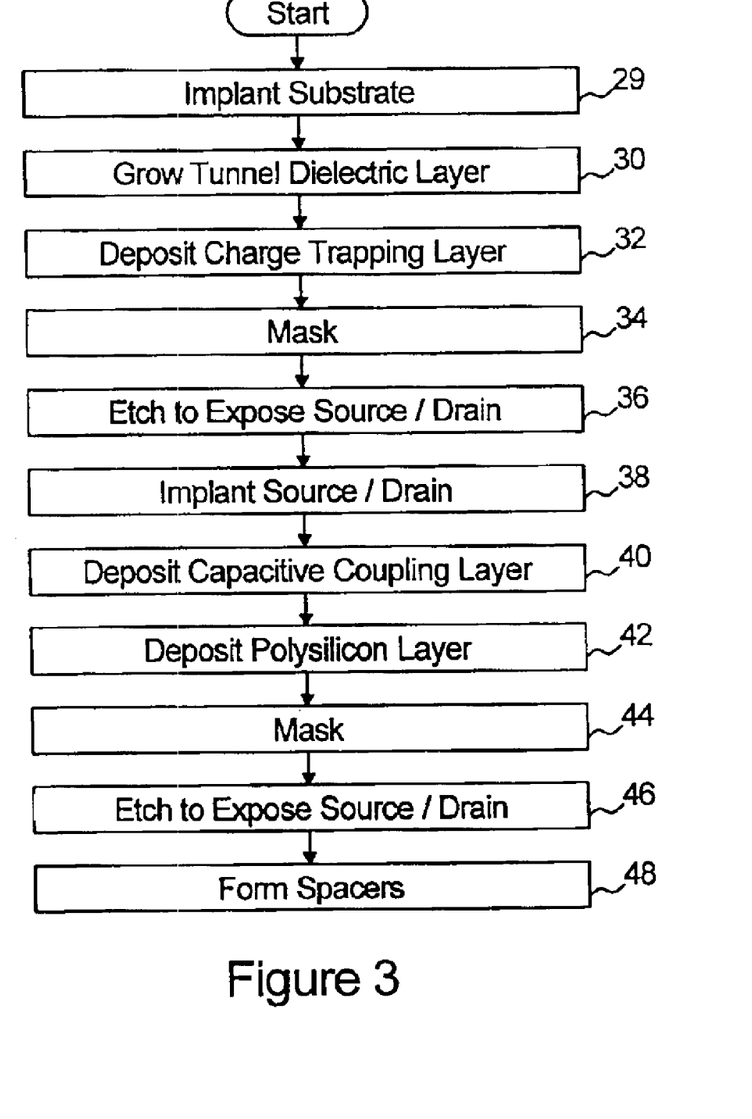
FIG. 3 is a flow chart diagram representing exemplary processing steps for fabricating the dielectric memory cell of FIG. 1.

Turning to the flowchart of FIG. 3 and the cross sectional diagrams of FIG. 4a to FIG. 4f, exemplary processing steps for fabricating the dielectric memory cell 10 of FIG. 1 in a planar structure are represented.

Step 29 represents lightly implanting a crystalline silicon substrate 12 with a group III hole donor element such as boron to form an p-type crystalline silicon substrate 12.

Figure 4A:
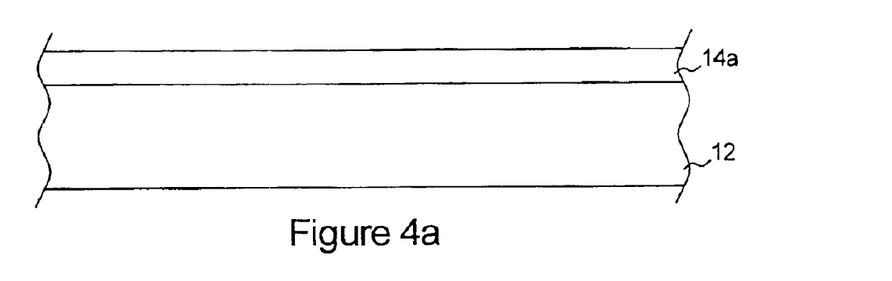
FIG. 4a is a cross section diagram of a processing step in the fabrication of the dielectric memory cell of FIG. 1.
Figure 4B:
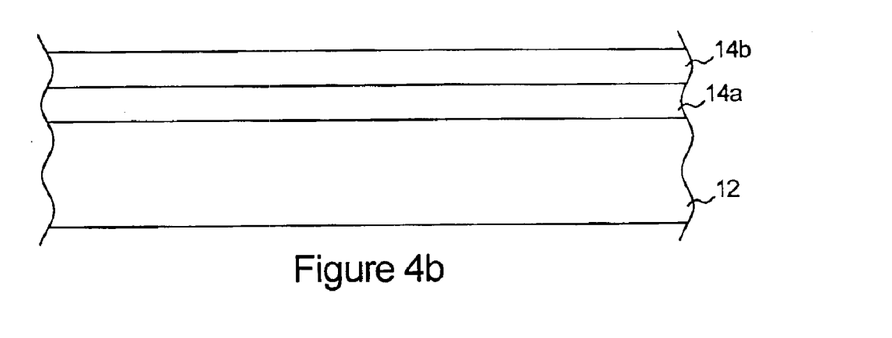
FIG. 4b is a cross section diagram of a processing step in the fabrication of the dielectric memory cell of FIG. 1.

Step 30 represents depositing or growing silicon dioxide or another chosen dielectric on the surface of the silicon substrate 12 to form the tunneling dielectric layer 14a on the surface of the p-type bulk wafer 12 as shown in FIG. 4a. As stated, the tunneling dielectric layer 14a may be deposited or grown to a thickness range between 70 Å to 130 Å.

Step 32 represents depositing the charge trapping dielectric layer 14b on the surface of the tunneling dielectric layer 14a as is shown in FIG. 4a. As stated, the charge trapping dielectric layer 14b may be deposited to a thickness range between 90 Å to 110 Å.

Figure 4C:
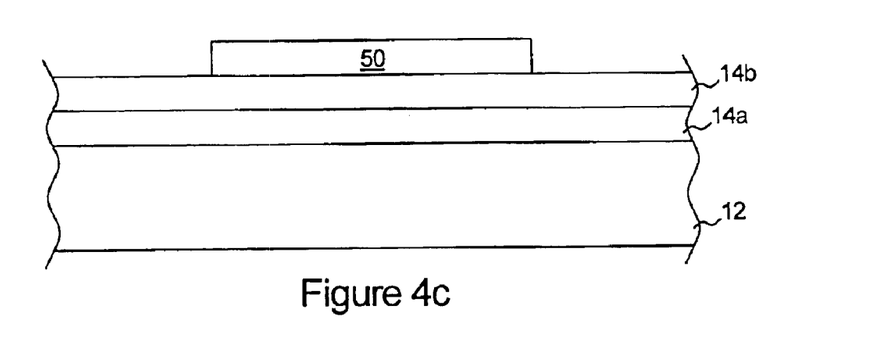
FIG. 4c is a cross section diagram of a processing step in the fabrication of the dielectric memory cell of FIG. 1.

Step 34 represents patterning a mask 50 on the surface of the charge trapping dielectric layer 14b to mask the portion of the charge trapping dielectric layer 14b over, and aligned with, the portion of the substrate 12 that is to become the central channel region 22 while exposing the portions of the charge trapping dielectric layer 14b over, and aligned with, the portions of the substrate 12 that are to become each of the source region 18 and the drain region 20. Mask 50 is represented in FIG. 4c.

Figure 4D:
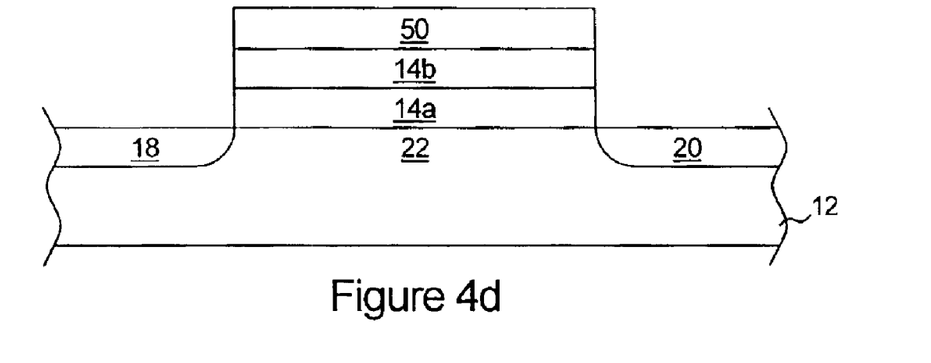
FIG. 4d is a cross section diagram of a processing step in the fabrication of the dielectric memory cell of FIG. 1.

Step 36 represents etching each of the charge trapping dielectric layer 14b and the tunnel dielectric layer 14a to expose the portions of the substrate 12 that are to become each of the source region 18 and the drain region 20 as is shown in FIG. 4d.

Step 38 represents implanting the source region 18, drain region 20, and bit lines (not shown) with a group V electron donor element such as arsenic to form an n-type silicon source region 18, drain region 20, and bit lines as shown in FIG. 4d. In the exemplary embodiment, the implant step 38 is performed before mask 50 is removed to minimize implant of the group V element into the charge trapping dielectric layer 14b.

Figure 4E:
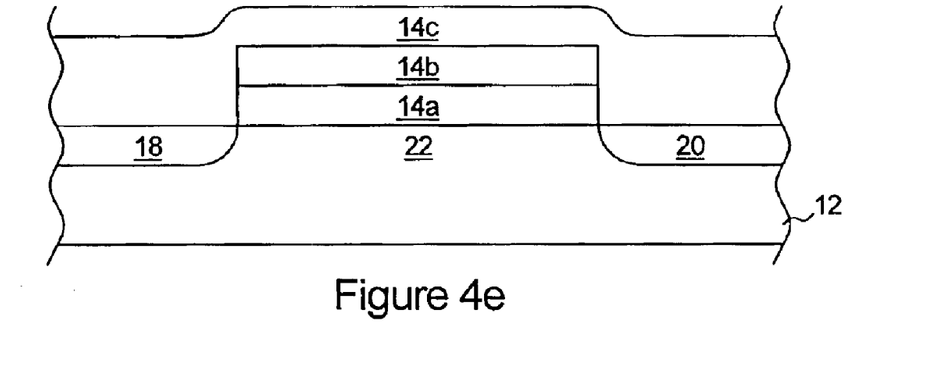
FIG. 4e is a cross section diagram of a processing step in the fabrication of the dielectric memory cell of FIG. 1.

Step 40 represents depositing, or growing, the top dielectric layer 14c across the surface including the exposed charge trapping dielectric layer 14b and the exposed source regions 18, drain regions 20, and bit lines as shown in FIG. 4e. Further as stated above, the top dielectric layer 14c may be deposited, or grown, to a thickness that is less than the thickness of the tunnel dielectric layer 14a. The top dielectric layer 14c may also be implanted as required to achieve the Fermi levels of the conduction band and valance band as described above.

Step 42 represents depositing a gate layer 31 over the surface of the top dielectric layer 14c and implanting the gate layer 31 with a group III hole donor element such as Boron to create a heavily P+ gate layer 31.

As previously discussed, the gate layer 31 may be polysilicon or may be a material selected from the group of materials consisting of GaN, ZnS, and C.

Figure 4F:
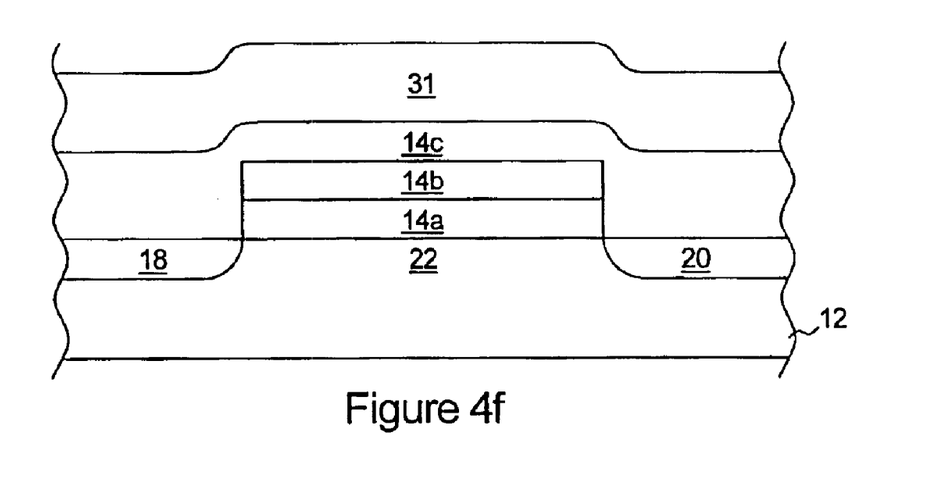
FIG. 4f is a cross section diagram of a processing step in the fabrication of the dielectric memory cell of FIG. 1.

The P+ doping concentration may be a dose of $1\times10^{12}$ atoms per square cm. Step 42 is represented by FIG. 4f.

Figure 4G:
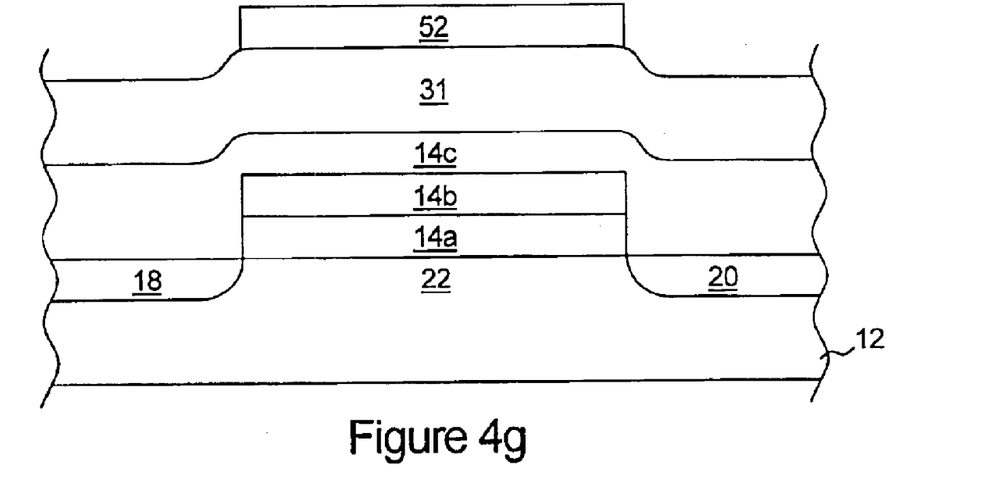
FIG. 4g is a cross section diagram of a processing step in the fabrication of the dielectric memory cell of FIG. 1.

Step 44 represents patterning a mask 52 on the surface of the gate layer 31 to mask the portion of the gate layer 31 over and aligned with the central channel region 22 while exposing the gate layer 31 over each of the source region 18 and the drain region 20 as represented in FIG. 4g.

Figure 4H:
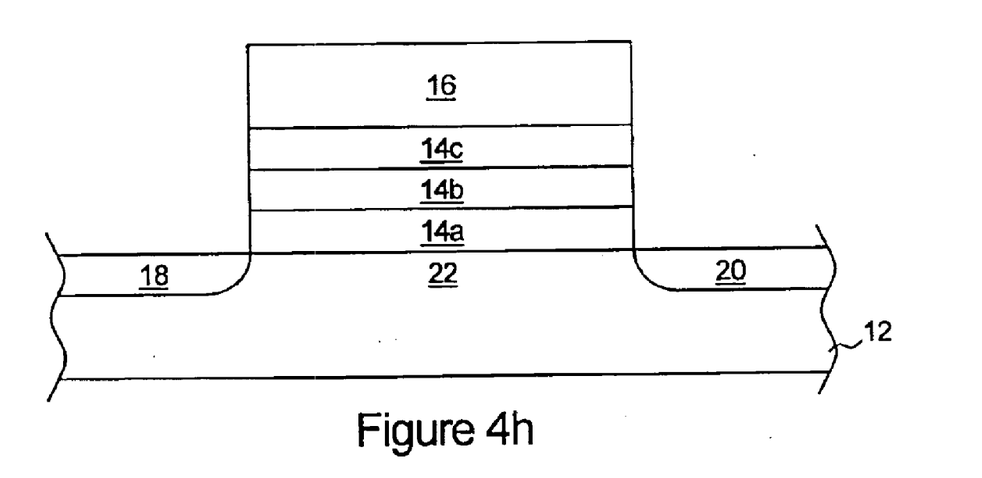
FIG. 4h is a cross section diagram of a processing step in the fabrication of the dielectric memory cell of FIG. 1.

Step 46 represents etching all of the exposed gate layer 31 and the top dielectric layer 14c to expose the substrate 22 in the source region 18 and drain region 20 as shown in FIG. 4h.

Step 48 represents forming Insulating nitride spacers 28 on the sides of the dielectric layers 14a, 14b, and 14c and the control gate 16 as is shown in FIG. 4i. More specifically, a layer of nitride is applied over the surface of the wafer and anisotropically etched to form the nitride spacers 28. Thereafter step 48 represents forming contacts (not shown) to the source region 18, drain region 20, and control gate 16.

It should be appreciated that the above described process provides for applying the control gate 16 after implanting of the source region 18 and drain region 20. As such, the implanting elements and concentrations of the source region and the drain region 20 do not alter the physical characteristics of the control gate 16. As such, the Fermi levels of each of the conduction band 56c and the valance band 56v of the control gate 16 may be controlled without altering the Fermi levels of the conduction band and valance band of the source region 18 or the drain region 20.

It should also be appreciated that such ability to independently implant the polysilicon control gate 16 provides for the ability to independently control the Fermi levels of the conduction band and valance band of each of the top dielectric 14c and the control gate 16. As such, Fermi levels of the conduction band and valance band of each can be engineered to achieve the ability to erase or neutralize a charge stored in either of charge storage region 24 and charge storage region 26 utilizing hole injection through the top dielectric layer 14c. This provides for improved reliability of the device by reducing transferring the break down effects of hot hole injection from the tunnel dielectric layer 14a to the top layer 14c.

Although the dielectric memory cell of this Invention has been shown and described with respect to certain preferred embodiments, it is obvious that equivalents and modifications will occur to others skilled In the art upon the reading and understanding of the specification. The present invention includes all such equivalents and modifications, and is limited only by the scope of the following claims.

What is claimed is:

1. A dielectric memory cell comprising:
   a) a substrate comprising a source region, a drain region, and a channel region positioned there between;

b) a multilevel charge trapping dielectric positioned on the surface of the substrate; and c) a control gate positioned on the surface of the multilevel charge trapping dielectric and positioned over and aligned with the channel region; and d) wherein the multilevel charge trapping dielectric includes:
   i) a tunneling dielectric layer adjacent to the substrate comprising a first dielectric material of a tunnel dielectric layer thickness;
   ii) a top dielectric layer adjacent to the control gate comprising a second dielectric material of a top dielectric thickness which is less than the tunnel dielectric thickness;
   iii) a charge trapping layer positioned between the tunneling dielectric layer and the top dielectric layer, wherein the control gate has a control gate conduction band Fermi level and a control gate valance band Fermi level; and
   wherein the difference between the control gate conduction band Fermi Level and a conduction band Fermi level of the top dielectric layer is less than the difference between the control gate valance band Fermi level and a valance band Fermi level of the top dielectric layer.

2. The dielectric memory cell of claim 1, wherein the control gate comprises polysilicon heavily implanted with a group III element.

3. The dielectric memory cell of claim 2, wherein the first dielectric material comprises silicon dioxide.

4. The dielectric memory cell of claim 3, wherein the second dielectric material comprises silicon dioxide.

5. The dielectric memory cell of claim 4, wherein the charge trapping layer comprises a nitride compound.

6. The dielectric memory cell of claim 5 wherein the charge trapping layer is a nitride compound selected from the group of nitride compounds consisting of $Si_2N_4$, $Si_3N_4$, and $SiO_xN_4$.

7. The dielectric memory cell of claim 6, wherein the second dielectric material is a dielectric selected from the group of an aluminum oxide compound, a Hafnium oxide compound, and a zirconium oxide compound.

8. The dielectric memory cell of claim 7, wherein the second dielectric material is a dielectric selected from the group of $Al_2O_3$, $HfSi_xO_y$, $HfO_2$, $ZrO_2$, and $ZrXi_xO_y$.

9. The dielectric memory cell of claim 1, wherein the control gate comprises a material selected from a group of materials consisting of GaN, ZnS, and C; and wherein such material is heavily implanted with a group III element.

10. The dielectric memory cell of claim 9, wherein the first dielectric material comprises silicon dioxide.

11. The dielectric memory cell of claim 10, wherein the second dielectric material comprises silicon dioxide.

12. The dielectric memory cell of claim 11, wherein the charge trapping dielectric layer comprises a nitride compound.

13. The dielectric memory cell of claim 12, wherein the charge trapping dielectric layer is a nitride compound selected from the group of nitride compounds consisting of $Si_2N_4$, $Si_3N_4$, and $SiO_xN_4$.

14. The dielectric memory cell of claim 13, wherein the second dielectric material is a dielectric selected from the group of an aluminum oxide compound, a Hafnium oxide compound, and a zirconium oxide compound.

15. The dielectric memory cell of claim 14, wherein the second dielectric material is a dielectric selected from the group of $Al_2O_3$, $HfSi_xO_y$, $HfO_2$, $ZrO_2$, and $ZrXi_xO_y$.

16. A charge trapping dielectric providing a non volatile storage of electrons in a dielectric memory cell, the charge trapping dielectric comprising:

a) a tunneling dielectric layer adjacent to a substrate comprising a first dielectric material of a tunnel dielectric thickness;

b) a top dielectric layer adjacent to a control gate comprising a second dielectric material having a top dielectric thickness, the top dielectric thickness being less than the tunnel dielectric thickness; and c) a charge trapping layer positioned between the tunneling dielectric layer and the top dielectric layer.

17. The charge trapping dielectric of claim 16, wherein the first dielectric material comprises silicon dioxide.

18. The charge trapping dielectric of claim 17, wherein the second dielectric material comprises silicon dioxide.

19. The charge trapping dielectric of claim 18, wherein the charge trapping layer comprises a nitride compound.

20. The charge trapping dielectric of claim 19, wherein the charge trapping layer is a nitride compound selected from the group of nitride compounds consisting of $Si_2N_4$, $Si_3N_4$, $SiO_xN_4$.

21. The charge trapping dielectric of claim 20, wherein the second dielectric material is a dielectric from the group of an aluminum oxide compound, a Hafnium oxide compound, and a zirconium oxide compound.

22. The charge trapping dielectric of claim 21, wherein the second dielectric material is a dielectric selected from the group of $Al_2O_3$, $HfSi_xO_y$, $HfO_2$, $ZrO_2$, and $ZrXi_xO_y$.

* * * * *

UNITED STATES PATENT AND TRADEMARK OFFICE
CERTIFICATE OF CORRECTION

PATENT NO. : 6,903,407 B1
DATED : June 7, 2005
INVENTOR(S) : Kang

It is certified that error appears in the above-identified patent and that said Letters Patent is hereby corrected as shown below:

Column 1,
Line 27, replace "negative. charge" with -- negative charge --
Line 54, replace "swept Into the" with -- swept into the --

Column 2,
Line 14, replace "its Interface with" with -- its interface with --
Line 50, replace "gate Is positively" with -- gate is positively --

Column 3,
Line 12, replace "ZrXi$_x$, O$_y$" with -- ZrSi$_x$O$_y$ --
Line 16, replace "present Invention" with -- present invention --

Column 4,
Line 8, replace "n-type Implanted" with -- n-type implanted --
Line 23, replace "electrons In a" with -- electrons in a --

Column 5,
Line 2, replace "ZrXi$_x$O$_y$" with -- ZrSi$_x$O$_y$ --

Column 6,
Lines 42-43, replace "more specifically,. the" with -- more specifically, the --

Column 8,
Line 27, replace "forming Insulating nitride" with -- forming insulating nitride --
Line 57, replace "this Invention has" with -- this invention has --
Line 60, replace "skilled In the art" with -- skilled in the art --

Column 9,
Line 45, replace "ZrXi$_x$O$_y$" with -- ZrSi$_x$O$_y$ --

UNITED STATES PATENT AND TRADEMARK OFFICE
CERTIFICATE OF CORRECTION

PATENT NO. : 6,903,407 B1
DATED : June 7, 2005
INVENTOR(S) : Kang

It is certified that error appears in the above-identified patent and that said Letters Patent is hereby corrected as shown below:

Column 10,
Lines 18 and 47, replace "$ZrXi_xO_y$" with -- $ZrSi_xO_y$ --

Signed and Sealed this

Ninth Day of August, 2005

JON W. DUDAS
*Director of the United States Patent and Trademark Office*